United States Patent
Chen et al.

(10) Patent No.: US 11,197,388 B2
(45) Date of Patent: Dec. 7, 2021

(54) AUTOMATIC OPENING AND CLOSING PROTECTION DEVICE

(71) Applicant: Quanta Computer Inc., Taoyuan (TW)

(72) Inventors: Chao-Jung Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 51 days.

(21) Appl. No.: 16/742,658

(22) Filed: Jan. 14, 2020

(65) Prior Publication Data
US 2021/0037670 A1    Feb. 4, 2021

Related U.S. Application Data

(60) Provisional application No. 62/879,770, filed on Jul. 29, 2019.

(51) Int. Cl.
*G06F 1/18*     (2006.01)
*H05K 7/14*     (2006.01)

(52) U.S. Cl.
CPC .................................. *H05K 7/1489* (2013.01)

(58) Field of Classification Search
CPC .............................. H05K 7/1489; G06F 1/184
See application file for complete search history.

(56) References Cited

U.S. PATENT DOCUMENTS

| | | | | |
|---|---|---|---|---|
| 3,800,328 A | * | 3/1974 | Harlan | G11B 15/675 360/137 |
| 5,351,228 A | * | 9/1994 | Kanno | G11B 17/0405 360/133 |
| 5,701,216 A | * | 12/1997 | Yamamoto | G11B 17/0405 360/96.51 |
| 6,377,451 B1 | * | 4/2002 | Furuya | G06F 1/1616 360/99.02 |
| 6,421,247 B1 | * | 7/2002 | Fuchimukai | H05K 7/1402 360/99.02 |
| 6,747,877 B2 | * | 6/2004 | Tonozuka | G06F 1/182 361/679.32 |
| 7,336,484 B2 | * | 2/2008 | McAnally | G06F 1/183 174/79 |
| 7,508,683 B1 | * | 3/2009 | Jochym | H05K 9/0062 361/816 |
| 7,679,898 B2 | * | 3/2010 | Peng | H05K 7/20618 361/679.37 |
| 8,254,108 B2 | * | 8/2012 | Chang | H05K 7/1489 361/679.36 |
| 9,055,675 B2 | * | 6/2015 | Chen | G06F 1/20 |
| 9,144,182 B2 | * | 9/2015 | Hu | H05K 7/20909 |
| 2009/0154114 A1 | * | 6/2009 | Peng | H05K 7/20736 361/728 |

(Continued)

*Primary Examiner* — Kimberley S Wright
(74) *Attorney, Agent, or Firm* — Nixon Peabody LLP

(57) ABSTRACT

A protective cover is provided in which connectors on a distal end of a motherboard are protected with the protective cover in a closed configuration. Sliding the motherboard into position within a chassis with the protective cover in the closed configuration automatically causes the protective cover to assume an open configuration, thereby exposing the connectors. Withdrawing the motherboard from the chassis results in automatically closing the protective cover through the operation of biasing elements (e.g., springs) that bias the protective cover into a normally closed configuration.

20 Claims, 9 Drawing Sheets

(56) References Cited

U.S. PATENT DOCUMENTS

| | | | |
|---|---|---|---|
| 2011/0053485 A1* | 3/2011 | Huang | H05K 7/20145 454/184 |
| 2012/0132598 A1* | 5/2012 | Wang | H05K 7/1487 211/26 |
| 2015/0069897 A1* | 3/2015 | Chen | H05K 5/0239 312/326 |
| 2020/0323106 A1* | 10/2020 | Peng | G06F 1/181 |

* cited by examiner

AUTOMATIC OPENING AND CLOSING PROTECTION DEVICE

CROSS REFERENCE TO RELATED APPLICATIONS

This application claims priority under 35 U.S.C. § 119 to U.S. Provisional Application No. 62/879,770, entitled "AUTOMATIC OPENING AND CLOSING PROTECTION DEVICE," filed Jul. 29, 2019. The contents of that application are hereby incorporated by reference in their entirety.

TECHNICAL FIELD

The present disclosure relates to data center computer equipment generally and more specifically to protective devices for computer modules.

BACKGROUND

In certain computing environments, it can be useful to provide certain computing elements in a modular fashion such that the computing element can be readily inserted and removed. For example, in data centers, chassis can include openings for accepting various computing modules, such as modules containing motherboards. The computing module can be inserted into the opening and slid into place in order to engage connectors on the motherboard of the computing module with complementary connectors within the chassis, such as on an interface board (e.g. mid plane board) within the chassis. Thus, multiple computing modules can be quickly inserted, removed, and/or replaced as necessary. However, as the size and importance of data centers increases, there is a need to install, remove, and/or replace such computing modules quickly to prevent or minimize downtime of critical computing power. Further, computing modules continue to become more complex, with denser and more delicate connectors. Thus, in such data centers, there is a risk of damage to the motherboard and its connectors during transport, storage, and installation of the computing modules.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

One disclosed example is an assembly having a frame for accepting a motherboard having one or more connectors. The frame has a distal end insertable into a chassis. The one or more connectors of the motherboard face outwards from the distal end when the motherboard is installed in the frame. A protective cover is movably coupled to the frame. The protective cover is moveable between a closed position protecting the one or more connectors and an open position exposing the one or more connectors. The protective cover automatically moves between the open position and the closed position as the frame is moved relative to the chassis.

In another disclosed implementation of the example assembly, the protective cover is movable through an inclined position during movement between the open position and the closed position. The protective cover is inclined relative to the one or more connectors when in the inclined position. In another disclosed implementation, the protective cover is in the closed position when the frame is not installed in the chassis. In another disclosed implementation, the protective cover is biased towards the closed configuration. In another disclosed implementation, the assembly includes a spring biasing the protective cover to the closed position. In another disclosed implementation, the protective cover moves to an open configuration when the frame is installed in the chassis. In another disclosed implementation, the assembly includes a baseplate slidably coupled to the frame. The protective cover is coupled to the baseplate to move between the open configuration and the closed configuration when the baseplate is slid with respect to the frame. In another disclosed implementation, the baseplate comprises a shoulder for engaging a mechanical feature of the chassis during insertion of the frame into the chassis to slide the baseplate relative to the frame as the frame is inserted into the chassis. In another disclosed implementation, the protective cover is rotatably coupled to the baseplate at a hinge, such that movement of the baseplate away from the distal end of the frame causes the protective cover to rotate about the hinge from the closed position to the open position. In another disclosed implementation, movement of the baseplate away from the distal end of the frame further induces the protective cover to slide beneath the motherboard. In another disclosed implementation, the mechanical feature of the chassis comprises a pin to contact the shoulder of the baseplate during insertion of the frame into the chassis to slide the baseplate with respect to the frame, and rotate the protective cover from the closed position into the open position. In another disclosed implementation, when the protective cover is in the open configuration, the protective cover is completely stored beneath the motherboard. In another disclosed implementation, the frame further comprises an end stop. The protective cover contacts the end stop in the closed position. The end stop is positioned to maintain a separation between the one or more connectors of the motherboard and the protective cover when the protective cover is in the closed position.

Another disclosed example is a method where a frame for accepting a motherboard having one or more connectors is provided. The frame has a distal end insertable into a chassis. The one or more connectors of the motherboard face outwards from the distal end when the motherboard is installed in the frame. The frame further includes a protective cover movably coupled to the frame. The frame is slide into the chassis. The protective cover is automatically moved from a closed position protecting the one or more connectors to an opened position exposing the one or more connectors in response to sliding the frame into the chassis.

In another disclosed implementation of the example method, the frame is removed from the chassis and the protective cover is automatically moved from the open position to the closed position in response to removing the frame from the chassis. In another disclosed implementation, the method includes biasing the protective cover into the closed position using a spring when the frame is not installed in the chassis. In another disclosed implementation, the automatically moving the protective cover from the closed position to the open position includes sliding a baseplate away from the distal end of the frame. The protective cover is rotatably coupled to the baseplate at a hinge. The automatically moving of the protective cover includes automatically rotating the protective cover about the hinge. In another disclosed implementation, the automatically moving the protective cover further includes sliding the protective cover beneath the motherboard. In another disclosed implementation, the sliding the frame into the chassis includes inserting the frame into the chassis. The protective cover is in the closed position when the frame is initially inserted into the chassis. The frame is slide to an intermediate position in the chassis. A shoulder of the baseplate engages a mechanical feature of the chassis in the intermediate position. The one or more connectors of the motherboard are spaced apart from one or more chassis connectors when the frame is in the intermediate position. The frame is slide to an engaged position in the chassis. The movement of the frame between the intermediate position and the engaged position induces relative movement of the baseplate with respect to the frame to slide the baseplate away from the distal end of the frame. The protective cover is in the open position when the frame is in the engaged position. In another disclosed implementation, the mechanical feature of the chassis is located such that the intermediate position occurs when the one or more connectors of the motherboard are within an opening of the chassis.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

Figure 1:
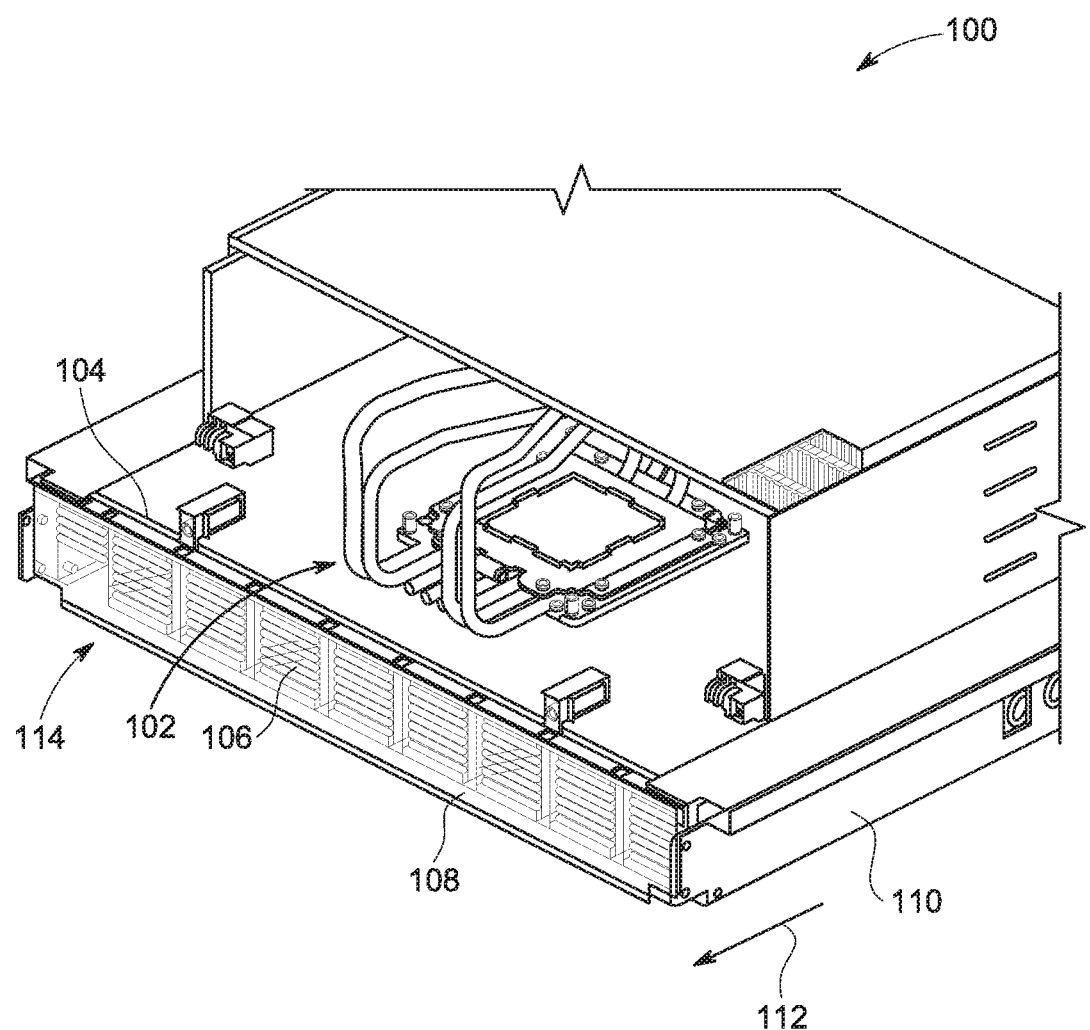
FIG. 1 is an axonometric projection of an assembly comprising a motherboard secured in a frame with a protective cover covering connectors of the motherboard, according to certain aspects of the present disclosure.

Certain aspects and features of the present disclosure relate to a frame or sled for supporting a motherboard or other circuit board having connectors, wherein the frame or sled includes a protective cover designed to automatically move between a closed position covering the connectors and an open position exposing the connectors. The protective cover can be rotatably coupled to a baseplate positioned between the motherboard and a bottom panel of the frame. The baseplate can be slidably coupled to the bottom panel and biased towards a distal end of the frame such that the protective cover is naturally biased into a closed position. When the frame is inserted into a chassis, a mechanical feature (e.g., pin or boss) can engage the baseplate and restrain the baseplate from moving deeper into the chassis while the remainder of the frame continues to move deeper into the chassis. This relative movement of the baseplate with respect to the frame can cause the protective cover to automatically move to an open position exposing the connectors (e.g., by being pulled underneath the motherboard by the relative movement of the frame and baseplate). Thus, the protective cover can automatically close whenever the frame is outside of a chassis, but automatically open whenever the frame is sufficiently inserted into the chassis.

The present invention is described with reference to the attached figures, wherein like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is an axonometric projection of an assembly 100 comprising a motherboard 102 secured in a frame 110 with a protective cover 108 covering connectors 106 of the motherboard 102, according to certain aspects of the present disclosure. The protective cover 108 is depicted as translucent for illustrative purposes. The frame 110 can be a sled or other framework designed to accept and secure a motherboard 102. As used herein, the term motherboard 102 can be inclusive of any suitable circuit board having connectors 106 at a distal end 104 of the board. In some cases, the motherboard 102 can be a board containing a central processing unit (CPU). Connectors 106 can face distally from the distal end 104 of the board (e.g., outwards from the distal end 114 of the frame 110) such that connectors 106 can engage complementary connectors within a chassis when the frame 110 is slid into the chassis.

As used herein, the term connectors 106 is inclusive of a single connector with multiple signal connections (e.g., electrical connections), as well as multiple connectors. For example, a motherboard 102 may have connectors 106 embodied as a single plug having multiple signal connections. In another example, a motherboard 102 may have connectors 106 embodied as multiple plugs, each having one or more signal connections.

As disclosed herein, the protective cover 108 can be biased towards a closed position in which the connectors 106 are covered or otherwise protected by the protective cover 108. However, upon insertion of the frame into a chassis, the protective cover 108 can be automatically moved to an open position in which the connectors 106 are exposed or otherwise available to engage complimentary connectors within the chassis.

Figure 2:
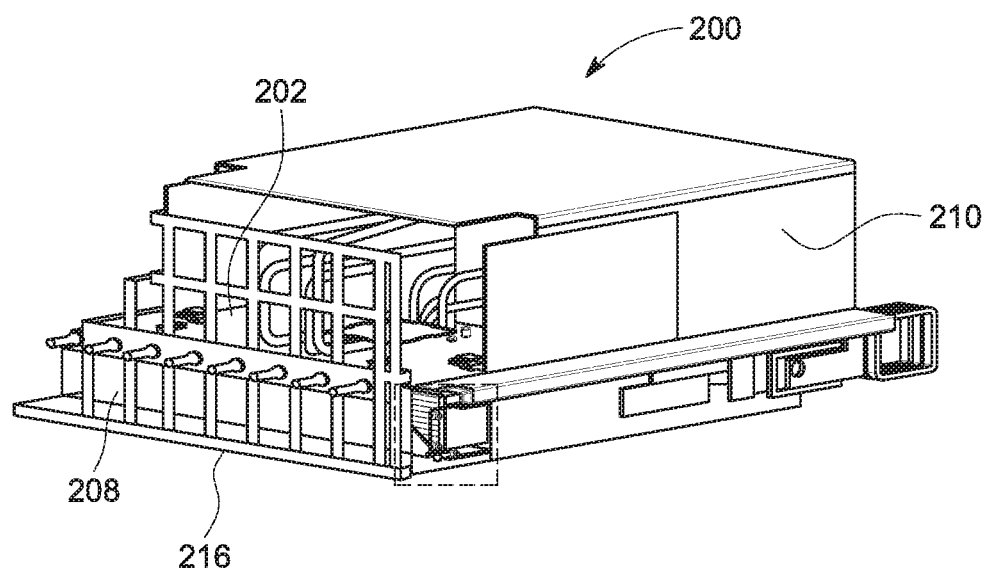
FIG. 2 is a cutaway axonometric projection of an assembly comprising a motherboard secured in a frame with a protective cover covering connectors of the motherboard being inserted into a chassis, according to certain aspects of the present disclosure.

FIG. 2 is a cutaway axonometric projection of an assembly 200 initially inserted into a chassis 216, the assembly comprising a motherboard 202 secured in a frame 210 with a protective cover 208 covering connectors of the motherboard 202, according to certain aspects of the present disclosure. The assembly 200 can be assembly 100 of FIG. 1. When initially inserted into the chassis 216, as well as prior to insertion into the chassis 216, the protective cover 208 can remain in a closed position protecting connectors of the motherboard 202. The protective cover 208 can be biased to the closed position.

Figure 3:
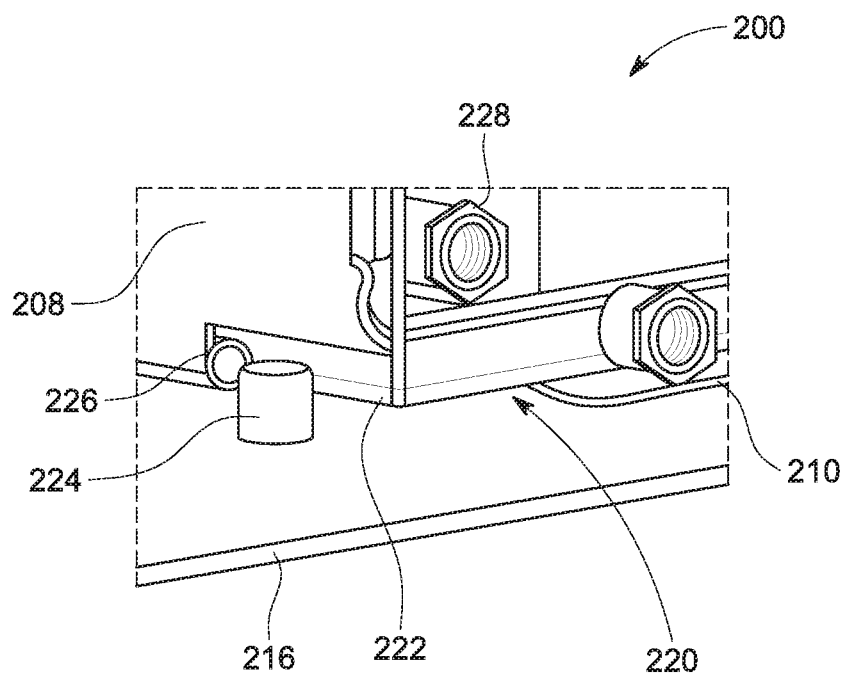
FIG. 3 is a close-up view depicting the assembly of FIG. 2 being inserted into a chassis, according to certain aspects of the present disclosure.

FIG. 3 is a close-up view depicting the assembly 200 of FIG. 2 being initially inserted into the chassis 216, according to certain aspects of the present disclosure. As the assembly 200 is initially inserted into the chassis 216, the protective cover 208 remains in the closed position. The protective cover 208 can be coupled to a baseplate 220 via a hinge 226. The protective cover 208 can rotate about the hinge 226. In some cases, however, the protective cover can be integral with or otherwise coupled to the baseplate, such as via a bendable material or section. When in the closed position, the protective cover 208 can be biased towards one or more end stops 228 of the frame 110. The end stop 228 can maintain a separation between the protective cover 208 and the connectors of the motherboard.

When initially inserted into the chassis 216, as well as prior to being inserted into the chassis 216, shoulders 222 of the baseplate 220 can remain separated from mechanical features 224 of the chassis 216. These mechanical features 224 can be configured to engage the shoulders 222 of the baseplate 220 when the assembly 200 is sufficiently inserted into the chassis 216. The mechanical features 224 can be pins, bosses, or any other suitable feature that can engage the baseplate 220. As used herein, the term shoulder 222 can be inclusive of any suitable mechanical element engageable by the mechanical features 224 of the chassis 216 to restrict movement of the baseplate 220, as the distal end of the frame 210 continues to be moved past the mechanical feature 224. In some cases, the frame 210 can include a cutout or opening (e.g., in a bottom surface of the frame) to permit the distal end of the frame 210 to move sufficiently far into the chassis 216 to permit the connectors of the motherboard to engage complementary connectors of the chassis.

Figure 4:
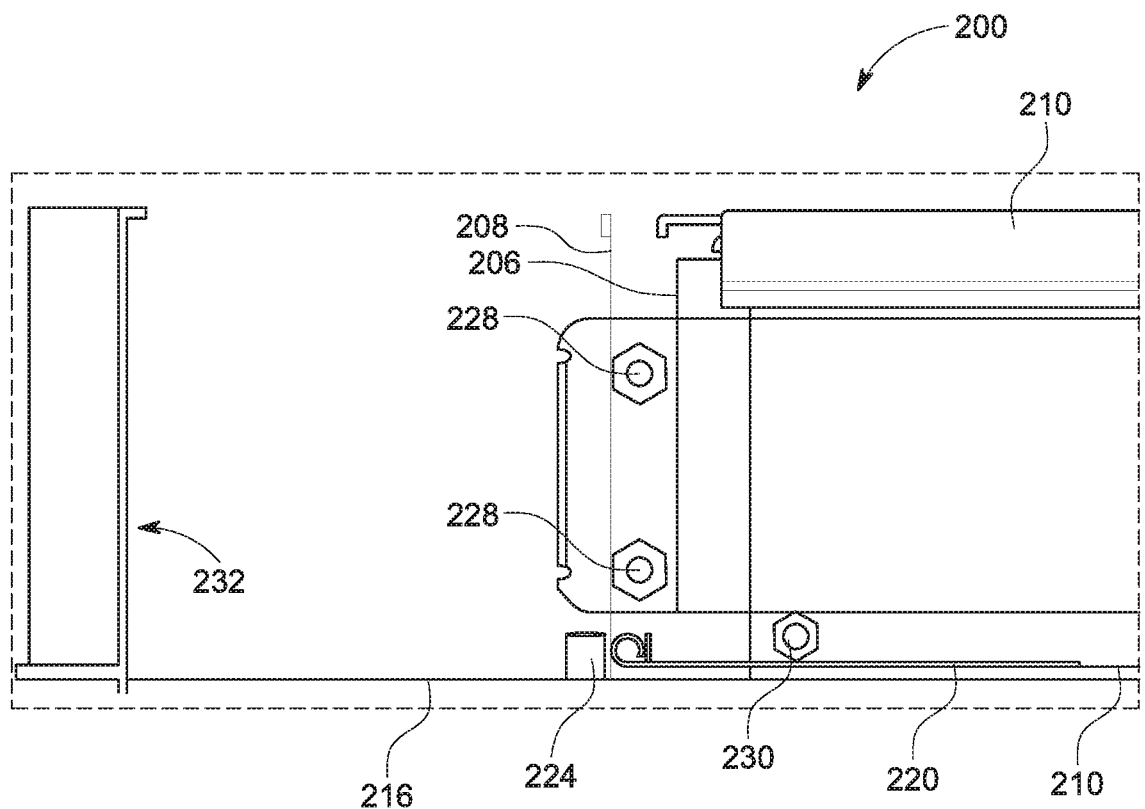
FIG. 4 is a side view depicting the assembly of FIG. 2 being inserted into a chassis, according to certain aspects of the present disclosure.

FIG. 4 is a side view depicting the assembly 200 of FIG. 2 being initially inserted into the chassis 216 according to certain aspects of the present disclosure. The frame 210 can support a motherboard such that the connectors 206 of the motherboard are aligned with complementary connectors 232 within the chassis 216, as the frame 210 is slid into the chassis 216. Either prior to or as the frame 210 is initially inserted into the chassis 216, the protective cover 208 can be in a closed position covering the connectors 206 of the motherboard of the assembly 200. The protective cover 208 can be biased against end stops 228.

In the position depicted in FIG. 4, the shoulder of the baseplate 220 can be spaced apart from the mechanical feature 224 of the chassis 216 such that the mechanical feature 224 is not engaging the baseplate 220. However, continued movement of the assembly 200 into the chassis 216 (e.g., from right to left as depicted in FIG. 4) can cause the mechanical feature 224 to engage the shoulder of the baseplate 220, as described in further detail herein.

As the assembly 200 is initially inserted into the chassis 216, the protective cover 208 remains in the closed position. The protective cover 208 can be coupled to a baseplate 220 via a hinge 226. The protective cover 208 can rotate about the hinge 226. In some cases, however, the protective cover can be integral with or otherwise coupled to the baseplate, such as via a bendable material or section. When in the closed position, the protective cover 208 can be biased towards one or more end stops 228 of the frame 110 (in FIG. 1). The end stop 228 can maintain a separation between the protective cover 208 and the connectors of the motherboard. In some cases, the frame 210 can include a slide post 230, against which the protective cover 208 can be pulled when being moved to an open position, as described in further detail herein.

Either prior to or while initially inserted into the chassis 216, shoulders 222 of the baseplate 220 can remain separated from mechanical features 224 of the chassis 216. These mechanical features 224 can be configured to engage the shoulders 222 of the baseplate 220 when the assembly 200 is sufficiently inserted into the chassis 216. The mechanical features 224 can be pins, bosses, or any other suitable feature that can engage the baseplate 220. As used herein, the term shoulder 222 can be inclusive of any suitable mechanical element engageable by the mechanical features 224 of the chassis 216 to restrict movement of the baseplate 220, as the distal end of the frame 210 continues to be moved past the mechanical feature 224. In some cases, the frame 210 can include a cutout or opening (e.g., in a bottom surface of the frame) to permit the distal end of the frame 210 to move sufficiently far into the chassis 216 to permit the connectors of the motherboard to engage complementary connectors of the chassis.

Figure 5:
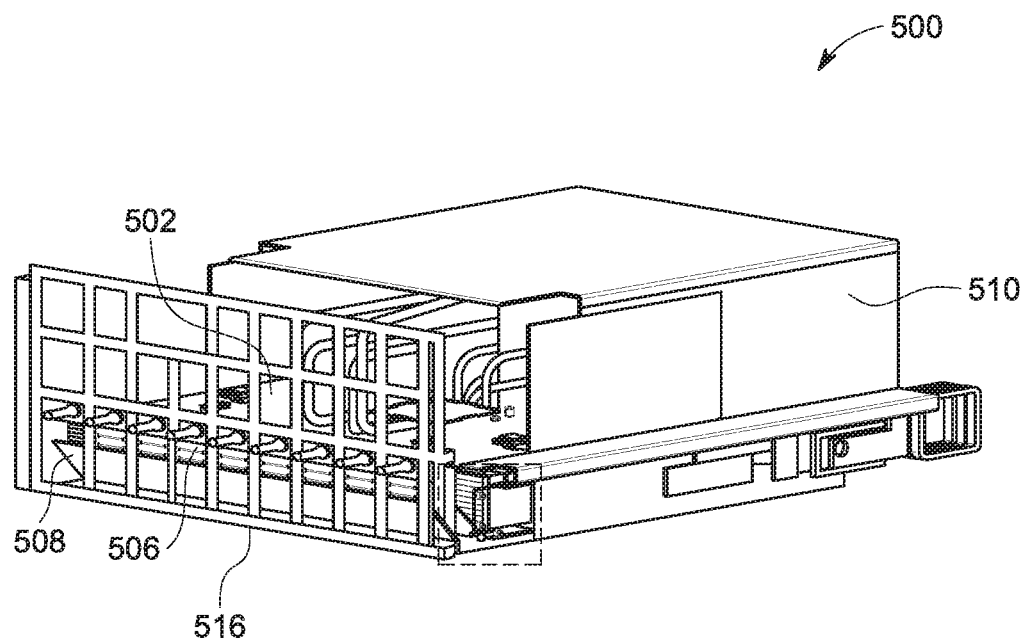
FIG. 5 is a cutaway axonometric projection of an assembly partially inserted into a chassis such that a protective cover of the assembly is in an inclined position beginning to expose connectors of a motherboard of the assembly, according to certain aspects of the present disclosure.

FIG. 5 is a cutaway axonometric projection of an assembly 500 partially inserted into a chassis 516, such that a protective cover 508 of the assembly 500 is in an inclined position beginning to expose connectors 506 of a motherboard 502 of the assembly 500, according to certain aspects of the present disclosure. The assembly 500 can be assembly 100 of FIG. 1. The assembly 500 can be assembly 200 of FIG. 2 after being inserted further into the chassis 216.

When partially inserted into the chassis 516, the protective cover 508 can be moved from a closed position protecting connectors 506 of the motherboard 502 towards and/or into an open position exposing the connectors 506 of the motherboard 502. As depicted in FIG. 5, the assembly 500 has been inserted to a position in which the protective cover 508 is inclined with respect to the connectors 506 (e.g., not parallel to or perpendicular to the connectors 506) and/or with respect to the motherboard 502 (e.g., not parallel to or perpendicular to the motherboard 502). The protective cover 508 can be biased to the closed position, but overcome due to interaction between the protective cover 508 and the chassis 516, such as via a baseplate engaging a mechanical feature of the chassis 516, although other techniques can be used.

Figure 6:
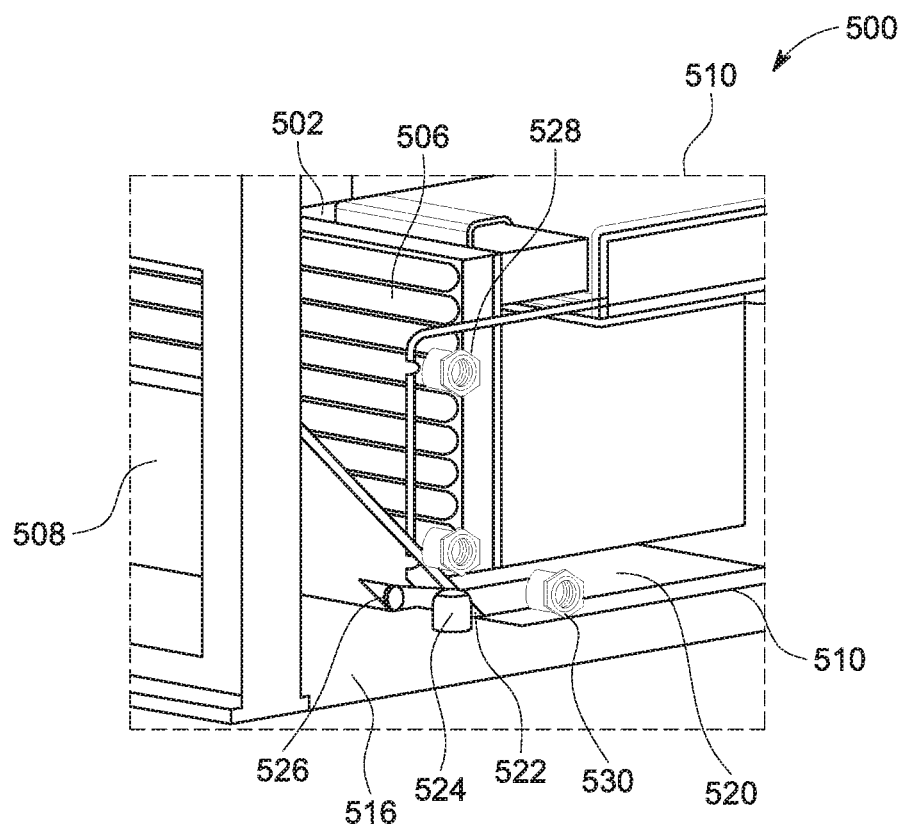
FIG. 6 is a close-up view depicting the assembly of FIG. 5 in the partially inserted position in the chassis, according to certain aspects of the present disclosure.

FIG. 6 is a close-up view depicting the assembly 500 of FIG. 5 in the partially inserted position in the chassis 516 according to certain aspects of the present disclosure. As depicted in FIG. 6, the protective cover 508 is in an inclined position, thereby partially exposing the connectors 506 of the motherboard 502. Since the protective cover 508 is normally biased towards the closed position, movement into the inclined position is accomplished by sliding the baseplate 520 with respect to frame 510. The protective cover 508 is coupled to baseplate 520, such as rotatably coupled by a hinge 526. Therefore, as the baseplate 520 moves with respect to the frame 510 (e.g., away from the distal end of the frame 510), the protective cover 508 is likewise pulled and moved with respect to the frame 510. When in the incline position, the protective cover 508 has been pulled against end stops 128, thus rotating about hinge 526.

The baseplate 520 is caused to move with respect to the frame 510 because shoulders 522 of the baseplate 520 engage mechanical features 524 of the chassis 516 as the frame 510 is inserted into the chassis 516. At the position depicted in FIG. 6, the frame 510 has been inserted into the chassis 516 sufficiently far to cause the mechanical features 524 of the chassis 516 to engage the baseplate 520 and move the baseplate 520 with respect to the frame 510.

From the position depicted in FIG. 6, further insertion of the assembly 500 into the chassis 516 can cause further movement of the baseplate 520, which can cause the protective cover 508 to be pulled against slide posts 530, thus moving the protective cover 508 to an open position in which the protective cover 508 exposes the connectors 506. In the open position, the protective cover 508 may lie in a flat position (e.g., approximately coplanar with the baseplate 520) due to interaction with the slide post 530.

Figure 7:
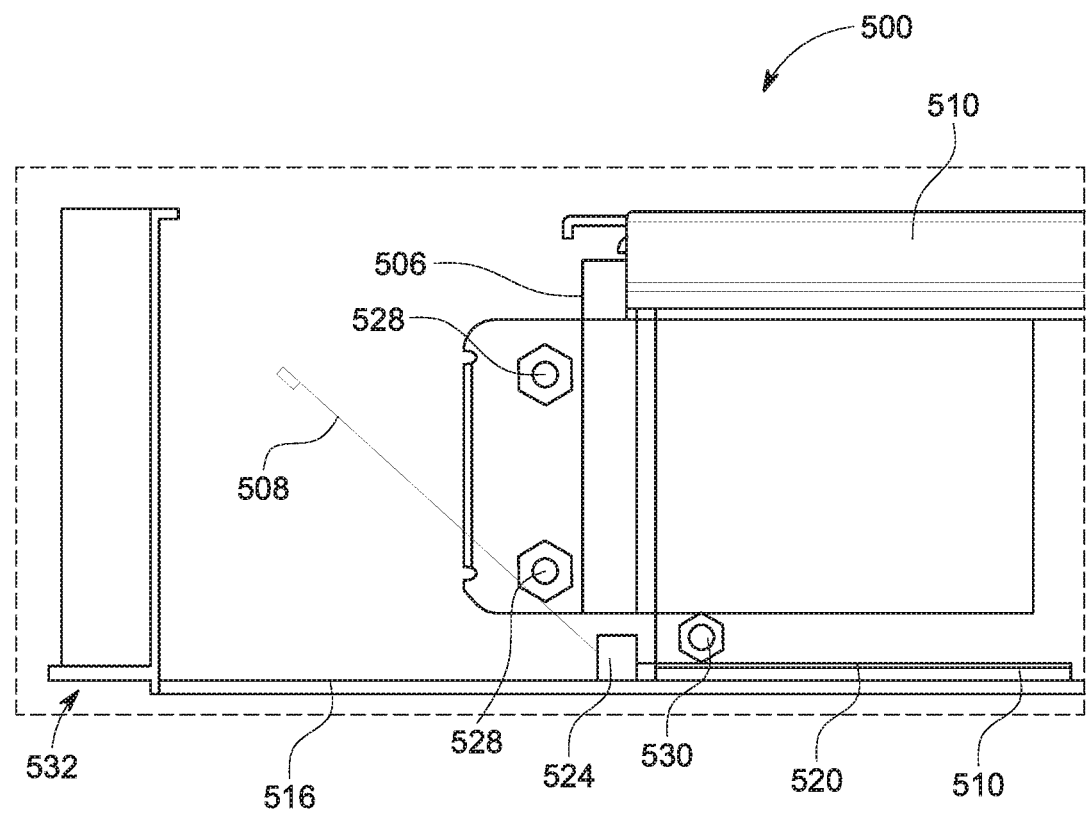
FIG. 7 is a side view depicting the assembly of FIG. 5 in the partially inserted position in the chassis, according to certain aspects of the present disclosure.

FIG. 7 is a side view depicting the assembly 500 of FIG. 5 in the partially inserted position in the chassis 516, according to certain aspects of the present disclosure. In this partially inserted position, the frame 510 has been inserted sufficiently far into the chassis 516 so as to cause the mechanical feature 524 to engage the baseplate 520 (e.g., a shoulder of the baseplate 520), thereby causing the baseplate 520 to move with respect to the frame 510. This movement of the baseplate 520 has caused the protective cover 508 to be pulled, and thus rotate away from connectors 506. The protective cover 508 can be pulled along some of the end stops 528, such as a bottom set of the end stops 528. Thus, the protective cover 508 can move from the closed position towards an open position without contacting connectors 506.

From the position depicted in FIG. 7, further insertion of the assembly 500 into the chassis 516 can cause further movement of the baseplate 520. The movement can cause the protective cover 508 to be pulled against slide posts 530, thus moving the protective cover 508 to an open position in which the protective cover 508 exposes the connectors 506. In the open position, the protective cover 508 may lie in a flat position (e.g., approximately coplanar with the baseplate 520) due to interaction with the slide post 530.

Figure 8:
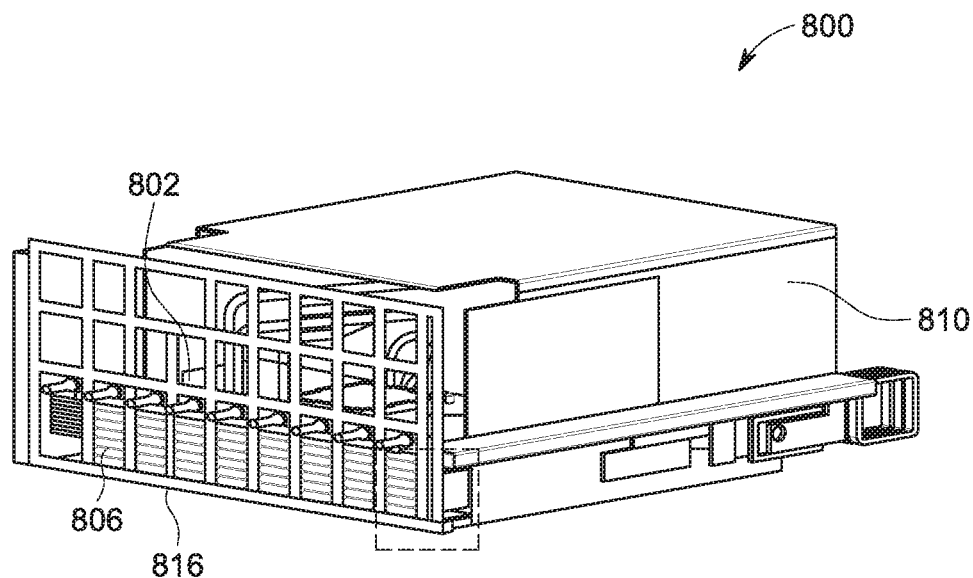
FIG. 8 is a cutaway axonometric projection of an assembly fully inserted into a chassis such that a protective cover of the assembly is in an open position exposing connectors of a motherboard of the assembly, according to certain aspects of the present disclosure.

FIG. 8 is a cutaway axonometric projection of an assembly 800 fully inserted into a chassis 816, such that a protective cover of the assembly 800 is in an open position exposing connectors 806 of a motherboard 802 of the assembly 800, according to certain aspects of the present disclosure. The assembly 800 can be assembly 100 of FIG. 1. The assembly 800 can be assembly 500 of FIG. 5 after being inserted further into the chassis 516.

When the assembly 800 is in the fully inserted position within the chassis 816, the connectors 806 of the motherboard 802 can engage complementary connectors (not shown for illustrative purposes) of the chassis. When in the fully inserted position, and at some point between the partially installed position as depicted in FIGS. 5-7 and the fully inserted position, the protective cover can be in the open position exposing the connectors 806 and permitting the connectors 806 to engage the complementary connectors of the chassis.

Figure 9:
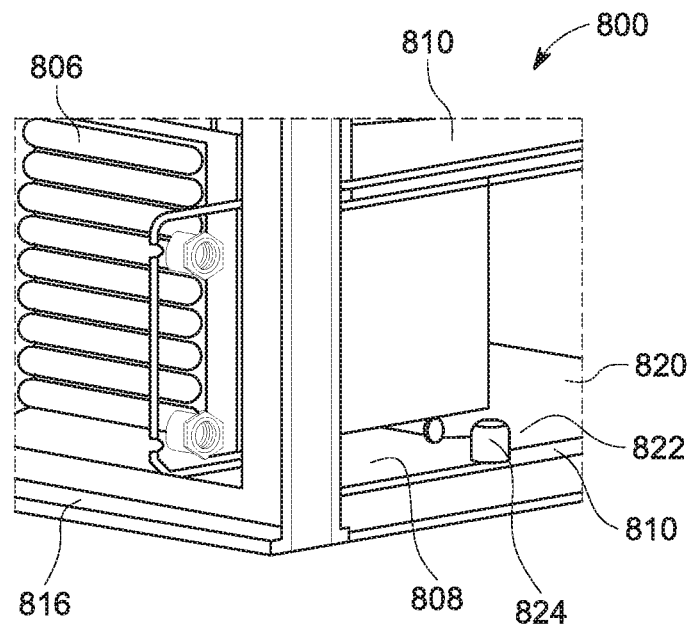
FIG. 9 is a close-up view depicting the assembly of FIG. 8 in the fully inserted position in the chassis, according to certain aspects of the present disclosure.

FIG. 9 is a close-up view depicting the assembly 800 of FIG. 8 in the fully inserted position in the chassis 816, according to certain aspects of the present disclosure. When in the fully inserted position, the frame 810 can be inserted sufficiently far into the chassis 816 such that the mechanical feature 824 of the chassis 816 has engaged the shoulders 822 of the baseplate 820, and moved the baseplate 820 with respect to the frame 810 sufficiently far to pull the protective cover 808 into the open position. In the open position, the protective cover 808 can be pulled flat or substantially flat (e.g., approximately coplanar with the baseplate 820). In the open position, the protective cover 808 can be pulled underneath the connectors 806 and/or underneath the motherboard 802. In some cases, when in the open position, the protective cover 808 can be located between the motherboard 802 and the frame 810, such as between the motherboard 802 and a bottom panel of the frame 810.

Figure 10:
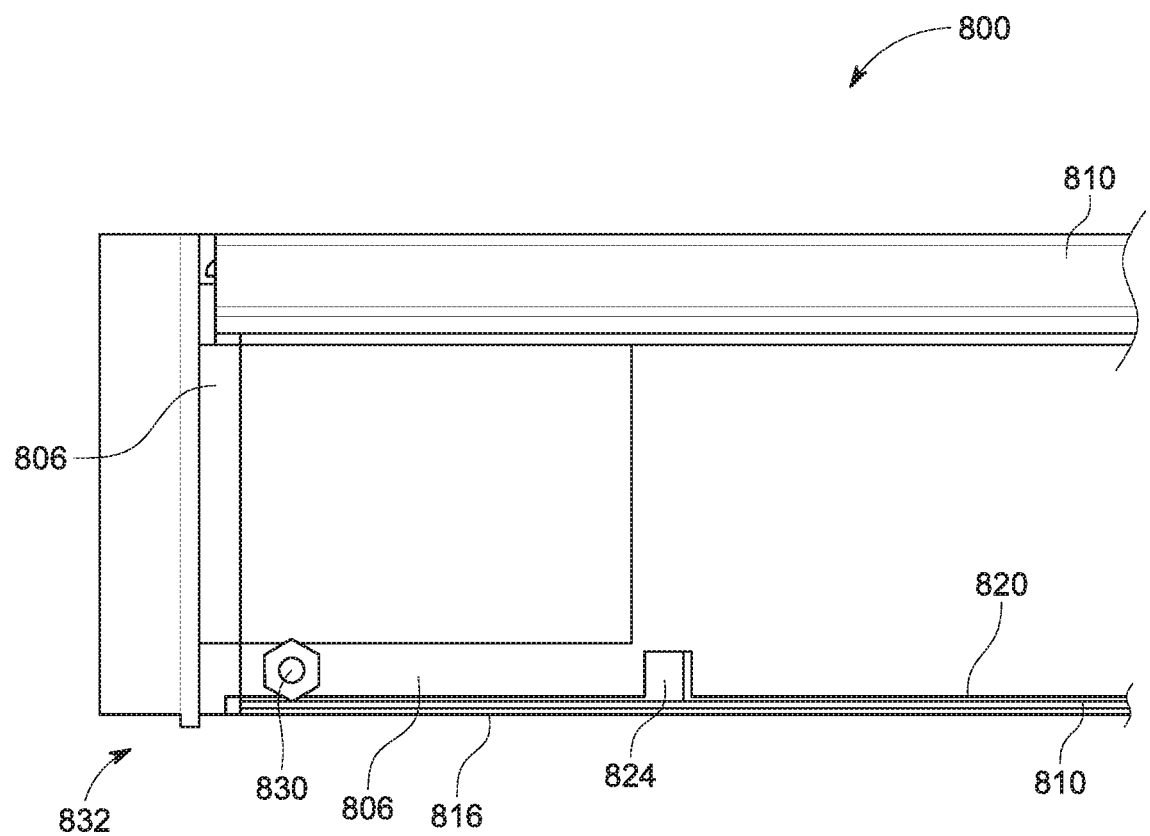
FIG. 10 is a side view depicting the assembly of FIG. 8 in the fully inserted position in the chassis, according to certain aspects of the present disclosure.

FIG. 10 is a side view depicting the assembly 800 of FIG. 8 in the fully inserted position in the chassis 816, according to certain aspects of the present disclosure. In the fully inserted position, the protective cover 808 is in an open position, thereby permitting the connectors 806 of the motherboard to engage complementary connectors 832 of the chassis 816.

Due to engagement of the mechanical feature 824 against the baseplate 820 during insertion of the assembly 800 into the chassis 816, movement of the frame 810 to the fully inserted position results in a relative movement between the baseplate 820 and the frame 810 (e.g., a relative movement of the baseplate 810 away from the distal end of the frame 810). As a result of this relative movement, the end stops, and slide post 130 of the frame 810 continues to move into the chassis as the baseplate 820 is held in place, thus causing the protective cover 808 to rotate downwards to the open position depicted in FIG. 10. In some cases, the slide post 130 can keep the protective cover 808 in a substantially flat orientation when in the open position. As depicted in FIG. 10, the protective cover 808 has been moved to a position underneath the connectors 806 and motherboard.

Figure 11:
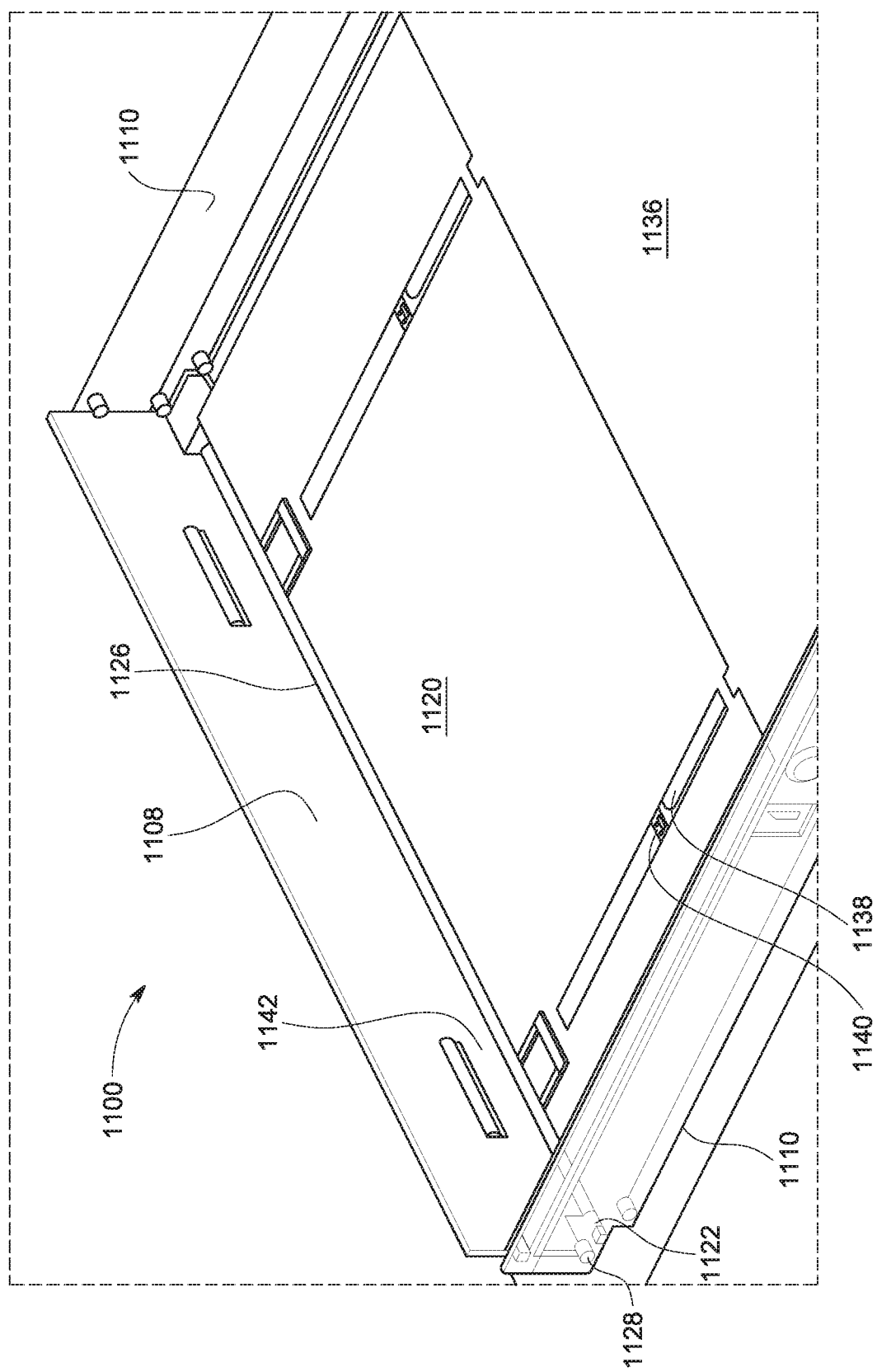
FIG. 11 is a cutaway axonometric projection of a frame of an assembly containing a protective cover, according to certain aspects of the present disclosure.

FIG. 11 is a cutaway axonometric projection of a frame 1110 of an assembly 1100 containing a protective cover 1108, according to certain aspects of the present disclosure. The frame 1110 can include a bottom panel 1136 and side walls, as well as other structures. The assembly 1100 can include a protective cover 1108 coupled to the frame 1110 via a baseplate 1120. The protective cover 1108 can be rotatably coupled to the baseplate 1120 via one or more hinges 1126. The protective cover 1108 can be biased into a closed position by a biasing element, such as a hinge spring 1142. Hinge spring 1142 can be a biasing element designed to bias the protective cover 1108 against end stops 1128.

The protective cover 1108 can be maneuvered into an open position by moving the baseplate 1120 relative to the frame 1110, such as by engaging shoulders 1122 of the baseplate 1120 using mechanical features of a chassis when inserting the assembly 1100 into a chassis. When the baseplate 1120 is moved away from a distal end of the frame 1110, the baseplate 1120 can cause the protective cover 1108 to move and rotate about hinge 1126. As the baseplate 1120 moves, the protective cover 1108 can interact with the end stops 128 and/or slide posts 130 to move the protective cover 1108 into an open position, such as through rotation of the protective cover 1108 from an orientation generally perpendicular with the baseplate 1120 to an orientation generally parallel to the baseplate 1120.

When force is removed from the shoulders 1122 of the baseplate 1120, such as during removal of the assembly 1100 from a chassis, a biasing element 1138 can bias the baseplate 1120 back to the position depicted in FIG. 11 (e.g., back to a closed position). The biasing element 1138 can couple the baseplate 1120 to a fixation point 1140 on the bottom panel 1136 of the frame 1110. In some cases, additional ridges, slots, or other mechanical features can be used to facilitate movement of the baseplate 1120 in a straight line with respect to the frame 1110. In some cases, the bottom panel 1136 of the frame 1110 can include cutouts or other features designed to permit passage of a mechanical feature of a chassis when the frame 1110 is fully inserted into the chassis, thereby permitting the mechanical feature to remain engaged with the shoulders 1122 of the baseplate 1120.

Figure 12:
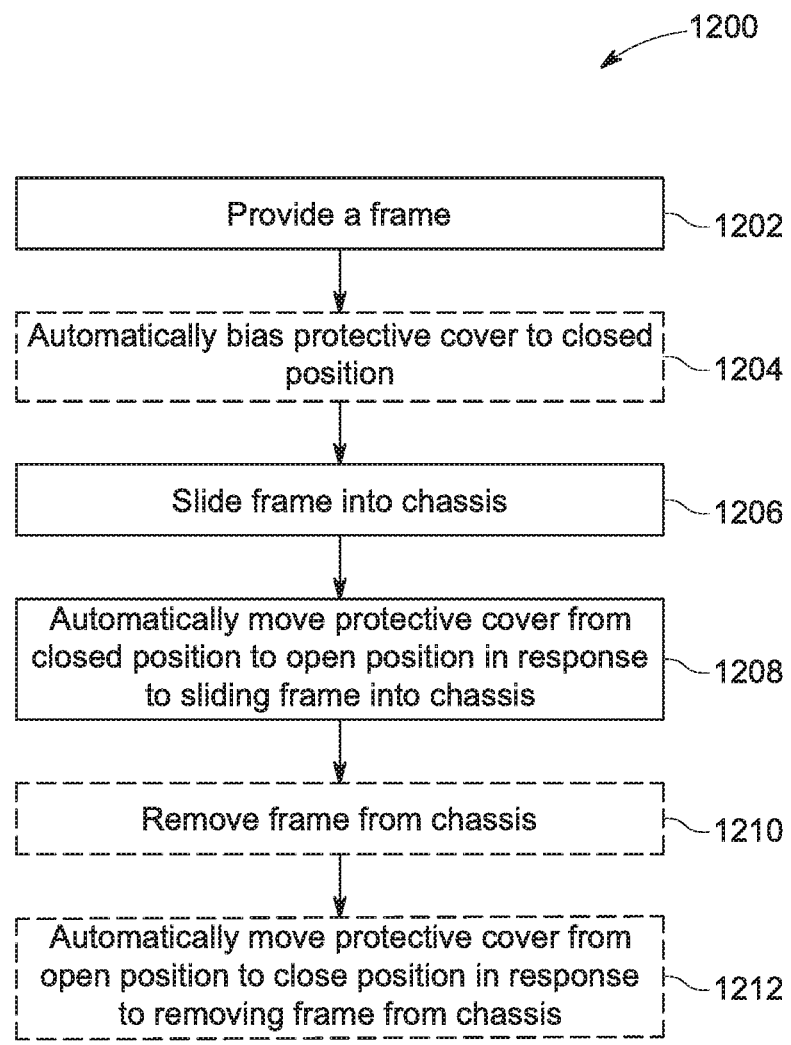
FIG. 12 is a flowchart depicting a process for automatically protecting connectors of a motherboard secured in a frame insertable in a chassis, according to certain aspects of the present disclosure.

FIG. 12 is a flowchart depicting a process 1200 for automatically protecting connectors of a motherboard secured in a frame insertable in a chassis, according to certain aspects of the present disclosure. Process 1200 can be used with assembly 100 of FIG. 1 or any other assembly disclosed herein. At step 1202, a frame is provided. The frame can be a frame for supporting a motherboard, such as frame 110 of FIG. 1. The frame can include a motherboard therein.

At optional step 1204, a protective cover of the frame can be automatically biased towards a closed position. The protective cover can be automatically biased through use of a biasing element, such as a spring or a flexible material.

At step 1206, the frame is slid into a chassis. The frame can be slid into a slot or opening of a chassis. At step 1208, the protective cover can be automatically moved from the closed position to an open position, in response to sliding the frame into the chassis at block 1206. Specifically, sliding the frame into the chassis can include initially inserting the frame into the chassis, continuing to slide the frame into the chassis to an intermediate position, and continuing to slide the frame into the chassis into an engaged position. When initially inserting the frame into the chassis, the protective cover can remain in a closed position. When the frame has reached the intermediate position, a shoulder of a baseplate of the assembly can engage a mechanical feature of the chassis to restrict further movement of the baseplate in the same direction, thus translating further movement of the frame into relative movement between the baseplate and the frame. At the intermediate position, the protective cover can be in the closed position. As the frame is moved from the intermediate position to the engaged position, movement of the frame can cause relative movement of the baseplate with respect to the frame to cause the protective cover to automatically move towards an open position. When the frame is in the engaged position, the protective cover can be in the open position and connectors of a motherboard in the frame can be operatively coupled to complementary connectors in the chassis.

At optional step 1210, the frame can be removed from the chassis. Removal of the frame from the chassis can be the reverse of sliding the frame into the chassis, as disclosed herein. At optional step 1212, the protective cover can automatically move from the open position to the closed position, in response to removing the frame from the chassis at block 1210.

In some cases, process 1200 can be repeated as necessary and can include additional elements as disclosed elsewhere herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An assembly, comprising:
   a frame for accepting a motherboard having one or more connectors, wherein the frame has a distal end insertable into a chassis, wherein the one or more connectors of the motherboard face outwards from the distal end when the motherboard is installed in the frame, and wherein the chassis includes a floor and a mechanical feature extending upward from the floor;
   a baseplate slidably coupled to the frame, the baseplate including a bottom plate and a shoulder extending upward from the bottom plate, the shoulder being configured to engage the mechanical feature of the chassis during insertion of the frame into the chassis such that the baseplate slides above the floor of the frame as the frame is inserted into the chassis; and a protective cover rotatably coupled to the baseplate and movably coupled to the frame, wherein the protective cover is moveable between a closed configuration protecting the one or more connectors and an open configuration exposing the one or more connectors, and wherein sliding the baseplate with respect to the frame causes the protective cover to automatically move between the open configuration and the closed configuration.

2. The assembly of claim 1, wherein the protective cover is rotated in an inclined configuration during movement between the open configuration and the closed configuration, and wherein the protective cover is inclined relative to the baseplate when in the inclined configuration.

3. The assembly of claim 1, wherein the protective cover is in the closed configuration when the frame is not installed in the chassis.

4. The assembly of claim 1, wherein the protective cover is naturally biased towards the closed configuration when the frame is not installed in the chassis.

5. The assembly of claim 4, further comprising a spring biasing the protective cover to the closed configuration when the frame is not installed in the chassis.

6. The assembly of claim 1, wherein the protective cover moves to the open configuration when the frame is installed in the chassis.

7. The assembly of claim 1, wherein the protective cover is rotatably coupled to the baseplate at a hinge, such that movement of the baseplate away from the distal end of the frame causes the protective cover to rotate about the hinge from the closed configuration to the open configuration.

8. The assembly of claim 7, wherein movement of the baseplate away from the distal end of the frame further induces the protective cover to slide beneath the motherboard.

9. The assembly of claim 1, wherein, when the protective cover is in the open configuration, the protective cover is completely stored beneath the motherboard and extends away from the baseplate.

10. The assembly of claim 1, wherein the frame further comprises an end stop configured to directly contact the protective cover when the protective cover is in the closed configuration, and wherein the end stop is positioned to maintain a separation between the one or more connectors of the motherboard and the protective cover when the protective cover is in the closed configuration.

11. A method comprising:
providing a frame for accepting a motherboard having one or more connectors, wherein the frame has a distal end insertable into a chassis, wherein the one or more connectors of the motherboard face outwards from the distal end when the motherboard is installed in the frame, wherein the chassis includes a floor and a mechanical feature extending upward from the floor;
sliding the frame into a chassis, such that a baseplate slides above the floor of the frame as the frame is inserted into the chassis, wherein the baseplate is slidably coupled to the frame and includes a bottom plate and a shoulder extending upward from the bottom plate, wherein the shoulder is configured to engage the mechanical feature of the chassis during insertion of the frame into the chassis; and
automatically moving a protective cover from a closed configuration protecting the one or more connectors to an open configuration exposing the one or more connectors in response to sliding the frame into the chassis, wherein the protective cover is rotatably coupled to the baseplate and movably coupled to the frame.

12. The method of claim 11, further comprising:
removing the frame from the chassis; and
automatically moving the protective cover from the open configuration to the closed configuration in response to removing the frame from the chassis.

13. The method of claim 11, further comprising biasing the protective cover into the closed configuration using a spring when the frame is not installed in the chassis.

14. The method of claim 11, wherein automatically moving the protective cover from the closed configuration to the open configuration comprises sliding the baseplate away from the distal end of the frame, wherein the protective cover is rotatably coupled to the baseplate at a hinge, and wherein automatically moving the protective cover comprises automatically rotating the protective cover about the hinge.

15. The method of claim 14, wherein automatically moving the protective cover further comprises sliding the protective cover beneath the motherboard.

16. The method of claim 14, wherein sliding the frame into the chassis comprises:
inserting the frame into the chassis, wherein the protective cover is in the closed configuration when the frame is initially inserted into the chassis;
sliding the frame to an intermediate position in the chassis, wherein the shoulder of the baseplate engages the mechanical feature of the chassis in the intermediate position, and wherein the one or more connectors of the motherboard are spaced apart from one or more chassis connectors when the frame is in the intermediate position; and
sliding the frame to an engaged position in the chassis, wherein movement of the frame between the intermediate position and the engaged position induces relative movement of the baseplate with respect to the frame to slide the baseplate away from the distal end of the frame, and wherein the protective cover is in the open configuration when the frame is in the engaged position.

17. The method of claim 16, wherein the mechanical feature of the chassis is located such that the intermediate position occurs when the one or more connectors of the motherboard are within an opening of the chassis.

18. An assembly, comprising:
a frame for accepting a motherboard having one or more connectors, wherein the frame has a distal end insertable into a chassis, wherein the one or more connectors of the motherboard face outwards from the distal end when the motherboard is installed in the frame;
a protective cover movably coupled to the frame, wherein the protective cover is moveable between a closed configuration protecting the one or more connectors and an open configuration exposing the one or more connectors, and wherein the protective cover automatically moves between the open configuration and the closed configuration as the frame is moved relative to the chassis; and
a baseplate slidably coupled to the frame,
wherein the protective cover is coupled to the baseplate to move between the open configuration and the closed configuration when the baseplate is slid with respect to the frame,
wherein the baseplate comprises a shoulder for engaging a mechanical feature of the chassis during insertion of the frame into the chassis to slide the baseplate relative to the frame as the frame is inserted into the chassis, and wherein the mechanical feature of the chassis comprises a pin to contact the shoulder of the baseplate during insertion of the frame into the chassis to slide the baseplate with respect to the frame, and rotate the protective cover from the closed configuration into the open configuration.

19. The assembly of claim 1, wherein the frame is a sled configured to accept and secure the motherboard.

20. The assembly of claim 1, wherein both the bottom plate and the shoulder of the baseplate are positioned on the same side of the mechanical feature.

* * * * *